United States Patent
Aji et al.

(10) Patent No.: US 7,137,097 B1
(45) Date of Patent: Nov. 14, 2006

(54) CONSTRAINT-BASED GLOBAL ROUTER FOR ROUTING HIGH PERFORMANCE DESIGNS

(75) Inventors: Sandeep A. Aji, San Francisco, CA (US); Ankur Narang, New Delhi (IN); Shantanu Ganguly, Austin, TX (US)

(73) Assignee: Sun Microsystems, Inc., Santa Clara, CA (US)

( * ) Notice: Subject to any disclaimer, the term of this patent is extended or adjusted under 35 U.S.C. 154(b) by 232 days.

(21) Appl. No.: 10/877,259

(22) Filed: Jun. 25, 2004

Related U.S. Application Data

(63) Continuation-in-part of application No. 10/228,540, filed on Aug. 27, 2002, now abandoned.

(51) Int. Cl.
*G06F 17/50* (2006.01)

(52) U.S. Cl. .................... 716/12; 716/7; 716/8; 716/13

(58) Field of Classification Search ............ 716/10–14, 716/7–8
See application file for complete search history.

(56) References Cited

U.S. PATENT DOCUMENTS

| | | | |
|---|---|---|---|
| 4,615,011 A | 9/1986 | Linkster | |
| 4,752,887 A | 6/1988 | Kuwahara | |
| 5,640,327 A | 6/1997 | Ting | |
| 5,754,824 A | 5/1998 | Damiano et al. | |
| 5,856,927 A | 1/1999 | Greidinger et al. | |
| 5,883,812 A | 3/1999 | Fujii | |
| 5,963,728 A | 10/1999 | Hathaway et al. | |
| 6,117,182 A | 9/2000 | Alpert et al. | |
| 6,122,443 A | 9/2000 | Nishikawa | |
| 6,134,702 A | 10/2000 | Scepanovic et al. | |
| 6,175,950 B1 | 1/2001 | Scepanovic et al. | |
| 6,223,328 B1 | 4/2001 | Ito et al. | |
| 6,279,142 B1 | 8/2001 | Bowen et al. | |
| 6,289,495 B1 | 9/2001 | Raspopovic et al. | |
| 6,353,918 B1 | 3/2002 | Carothers et al. | |
| 6,405,350 B1 | 6/2002 | Tawada | |
| 6,480,991 B1 | 11/2002 | Cho et al. | |
| 6,510,545 B1 | 1/2003 | Yee et al. | |
| 6,546,529 B1 | 4/2003 | Dansky et al. | |
| 6,550,042 B1 | 4/2003 | Dave | |
| 6,594,805 B1 | 7/2003 | Tetelbaum et al. | |
| 6,601,222 B1 | 7/2003 | Mehrotra et al. | |
| 6,611,944 B1 | 8/2003 | Elzinga | |
| 6,629,306 B1 | 9/2003 | Bobba et al. | |

(Continued)

OTHER PUBLICATIONS

Standard Delay Format Specification, Version 3.0, Open Verilog International, May 1995.

(Continued)

*Primary Examiner*—Paul Dinh
(74) *Attorney, Agent, or Firm*—Zagorin O'Brien Graham LLP

(57) ABSTRACT

A method, system, computer system, and computer program product including an algorithm that performs the constraints-based global routing step in the physical design of integrated circuits. The algorithm is based on finding routes for the entire circuit based on constraints being satisfied for the entire design. Initially, for each net, a set of possible routing solutions is determined based on applicable constraints. The possible solutions for the nets are combined to create a highly-connected "intersection graph," with each intersection graph node representing a net. The intersection graph is partitioned based on constraints and performance criteria. An optimal solution is determined for each partition. The optimal solutions for the partitions are then combined to produce a global routing solution. The global routing solution is provided to a detailed router, which completes the routing for the design.

88 Claims, 7 Drawing Sheets

U.S. PATENT DOCUMENTS 6,957,409 B1 * 10/2005 Teig et al. ................. 716/12
2004/0044979 A1 * 3/2004 Aji et al. .................. 716/13

OTHER PUBLICATIONS

Chiang, C. et al., "A Powerful Global Router Based on Steiner Min-Max Trees", Proceedings of IEEE International Conference on Computer-Aided Design, pp. 2-5, Nov. 7-10, 1989.

Elmore, W.C., "The Transient Response of Damped Linear Networks with Particular Regard to Wideband Amplifiers", Journal of Applied Physics, vol. 19(1), 1948.

Fiduccia, C.M. et al., "A Linear Time Heuristic for Improving Network Partitions", Proceedings of the 19th Design Automation Conference, pp. 175-181, 1982.

Mikami, K. et al.., "A Computer Program for Optimal Routing of Printed Circuit Connectors", IFIPS Proceedings, pp. 1475-1478, 1969.

Penfield, Paul et al., "Signal Delay in RC Tree Networks", IEEE 18th Design Automation Conference, 1981.

* cited by examiner

CONSTRAINT-BASED GLOBAL ROUTER FOR ROUTING HIGH PERFORMANCE DESIGNS

CROSS-REFERENCE TO RELATED APPLICATION(S)

This application is a continuation-in-part of application Ser. No. 10/228,540, filed Aug. 27, 2002 now abandoned.

BACKGROUND

1. Field of the Invention

The present invention relates to automated routing tools for integrated circuit designs.

2. Description of the Related Art

With the advent of circuit feature sizes in the sub-micron range, integrated circuits involving millions of transistors on a single chip have become commonplace. Due to the sheer number of devices on a single chip, an entire industry has evolved specifically to supply the semiconductor industry with software and hardware tools to automate much of the process of integrated circuit design.

Design automation tools are computer-based tools that assist through automation of procedures that would otherwise be performed manually. Simulation of proposed design functionality and synthesis of integrated circuit logic and layout are two examples. Design verification tools are computer-based tools used to verify that circuit design or layout meets certain prescribed objectives.

Both design automation and design verification tools require computer-readable descriptions of the underlying circuit function and structure to operate. These computer-based descriptions vary from simple geometrical specification languages, such as Caltech Intermediate Form (CIF) to high-level functional description languages such as VHDL (a hardware design language). Geometrical specification languages for integrated circuits allow computer-readable definition of the geometries of the mask layers required to fabricate an integrated circuit. These specification languages contain primitive structures such as wires and boxes to specify geometrical shapes and layout levels. Organizational constructs are also provided to allow placement and repetition of the geometrical structures.

Most design tools are hierarchical in nature and employ more than one type of routing algorithm for routing interconnections between circuit components. Most routing tools used for cell-based designs begin with the placement of circuit elements, cells and/or cell blocks. Placement can be manual or automated, and typically decisions are made about where connectors to the circuit elements, cells and/or cell blocks should be located. Placement also includes determining the placement and orientation of blocks relative to one another. Such decisions can be driven by considerations of circuit compaction, which affects circuit congestion (similar to traffic congestion), the number of interconnect lines running between the blocks, and so on. With gate array designs, there is no placement step because placement has been predetermined by the manufacturer.

The next step in completing the circuit design is typically a global routing step, which is an attempt to logically determine a path for each interconnection between cells in the entire design. Routing decisions are made based on the available avenues formed by the current placement of circuit elements and/or blocks, and are assigned in consideration of various costs, also referred to herein as constraints (e.g., to incur the shortest total length of interconnect lines between the connectors). Once the global router has assigned the general flow of interconnect lines, a detailed router attempts to make the interconnect lines fit the assignments made by the global router.

A set of two or more interconnected cells in a circuit design is referred to herein as a "net." A "net list" is a set of statements in a geometrical specification language that specifies the elements of a circuit, such as transistors and gates, and their interconnections. Individual transistors are described, along with cells to which they connect. The net list allows creation of a circuit diagram based on the actual geometrical specification statements. The creation of the circuit diagram is referred to as "circuit extraction," and the extracted circuit can be compared to the original circuit specified by the designer to determine differences. A difference usually indicates an error that must be corrected.

In addition to providing the details of circuit interconnection, circuit extraction is useful for calculating layout areas and perimeters for each integrated circuit layer at each node of the circuit. These layout areas and perimeters can be used to accurately calculate the parasitic capacitances and resistance that load the active devices. With accurate capacitances and resistances from circuit extraction, a design can be accurately simulated to ensure correct operation. Thus, circuit extraction is an essential design verification tool for accurate characterization of modern integrated circuits.

A typical analysis in designing a circuit involves developing a routing solution for routing interconnections between circuit components. The routing solution is then evaluated using a constraint engine to identify nets that do not meet specified criteria, such as minimum spacing between nets. Offending nets are manually re-routed, and the routing solution and constraint engine re-run. This process is referred to as "parasitic extraction."

As more complicated designs are developed to achieve higher performance and higher reliability, the demands placed on routing tools increase. Most current routing tools, provided by Electronic Design Automation (EDA) vendors, are insufficient to achieve the quality of route desired without several iterations and design cycles. Furthermore, most routing tools are primarily concerned with minimal distance as a constraint on global routing and do not permit timing to be directly considered.

What is needed is a new global routing technique to achieve a high quality, highly reliable route in as few iterations as possible. The global router should provide the capability to handle timing, noise avoidance, shielding and cell (repeater or latch) insertion constraints. The global router should produce output that can be used by a commercially available detailed router to complete the routing.

SUMMARY

The present invention includes an algorithm that performs the constraints-based global routing step in the physical design of integrated circuits. The algorithm is based on finding routes for the entire circuit based on constraints being satisfied for the entire design. Initially, for each net, a set of possible routing solutions is determined based on applicable constraints. The possible solutions for the nets are combined to create a highly-connected "intersection graph," with each intersection graph node representing a net. Edges are added between intersection graph nodes for nets which "intersect," indicating that the nets share a region on the circuit's floorplan. Weights, based on constraints, are added to the edges of the intersection graph. Using these weights, the intersection graph is "pruned" to eliminate edges, producing a sparse graph. The intersection graph is partitioned based on constraints and performance criteria. An optimal solution is determined for each partition. The optimal solutions for the partitions are then combined to produce a global routing solution. The global routing solution is provided to a detailed router, which completes the routing for the design.

In one feature, a method includes finding a solution set including at least one route solution for each net of multiple nets of an integrated circuit design. The method further includes creating an intersection graph using the solution sets for the nets and partitioning the intersection graph into multiple partitions. The method further includes identifying an optimal solution satisfying a constraint for each partition and using the optimal solution for each partition to complete a global routing for the design such that the global routing satisfies the constraint.

In another feature, a method includes finding a route solution for each net of multiple nets of an integrated circuit design. The method further includes creating an intersection graph for the nets using each route solution for each of the nets. The method further includes partitioning the intersection graph into multiple partitions and identifying an optimal solution satisfying a constraint for each partition. The method also includes using the optimal solution for each partition to complete a global routing for the design such that the global routing satisfies the constraint.

In another feature, a system includes finding means for finding a solution set comprising at least one route solution for each net of multiple nets of an integrated circuit design. The system further includes creating means for creating an intersection graph for the nets using the solution sets for the nets. The system further includes partitioning means for partitioning the intersection graph into multiple partitions. The system further includes identifying means for identifying an optimal solution satisfying a constraint for each partition and using means for using the optimal solution for each partition to complete a global routing for the design such that the global routing satisfies the constraint.

In yet another feature, a computer program product includes finding instructions to find a solution set comprising at least one route solution for each net of multiple nets of an integrated circuit design. The computer program product further includes creating instructions to create an intersection graph for the nets using the solution sets for the nets. The computer program product further includes partitioning instructions to partition the intersection graph into multiple partitions. The computer program product further includes identifying instructions to identify an optimal solution satisfying a constraint for each partition of the partitions and using instructions to use the optimal solution for each partition to complete a global routing for the design such that the global routing satisfies the constraint. The computer program product further includes a computer-readable medium to store the finding instructions, the creating instructions, the partitioning instructions, the identifying instructions, and the using instructions.

In another feature, a computer system includes a processor for executing instructions and a memory to store the instructions. The instructions include finding instructions to find a solution set comprising at least one route solution for each net of multiple nets of an integrated circuit design. The instructions further include creating instructions to create an intersection graph for the nets using the solution sets for the nets and partitioning instructions to partition the intersection graph into multiple partitions. The instructions further include identifying instructions to identify an optimal solution satisfying a constraint for each partition and using instructions to use the optimal solution for each partition to complete a global routing for the design such that the global routing satisfies the constraint.

In still another feature, a system comprises a finding module to find a solution set comprising at least one route solution for each net of multiple nets of an integrated circuit design and a creating module to create an intersection graph for the nets using the solution sets for the nets. The system further includes a partitioning module to partition the intersection graph into multiple partitions and an identifying module to identify an optimal solution satisfying a constraint for each partition. The system further includes a using module to use the optimal solution for each partition to complete a global routing for the design such that the global routing satisfies the constraint.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

Figure 2:
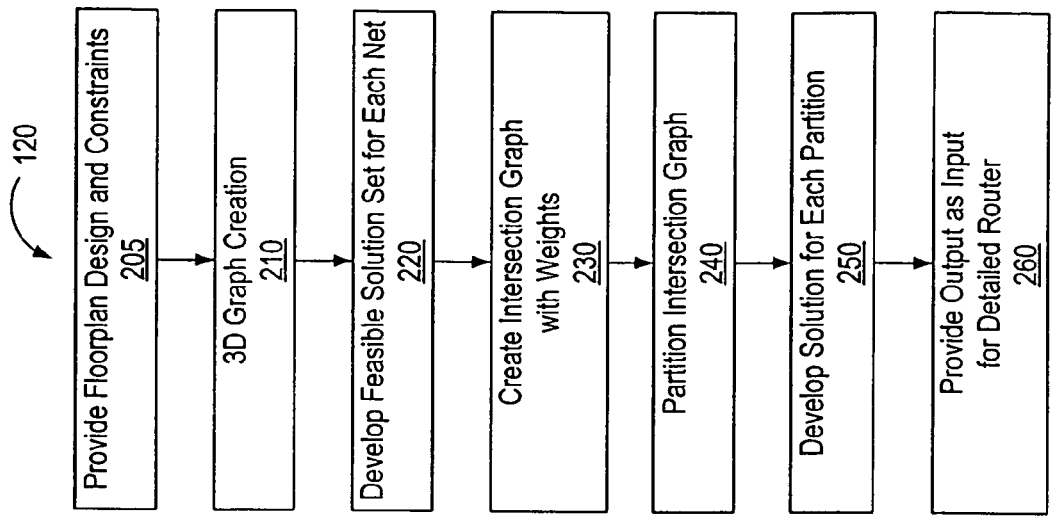
FIG. 2 shows an algorithm to perform constraints-based global routing in the physical design of integrated circuits.

While the invention is susceptible to various modifications and alternative forms, specific embodiments are shown by way of example in the Drawings and are described herein in detail. The Drawings and Detailed Description are not intended to limit the invention to the particular form disclosed. On the contrary, the intention is to cover all modifications, equivalents, and alternatives falling within the

DESCRIPTION OF THE PREFERRED EMBODIMENT(S)

For a thorough understanding of the subject invention, refer to the following Detailed Description, including the appended Claims, in connection with the above-described Drawings.

Although the present invention is described in connection with several embodiments, the invention is not intended to be limited to the specific forms set forth herein. On the contrary, it is intended to cover such alternatives, modifications, and equivalents as can be reasonably included within the scope of the invention as defined by the appended Claims.

In the following description, for purposes of explanation, numerous specific details are set forth in order to provide a thorough understanding of the invention. It will be apparent, however, to one skilled in the art that the invention can be practiced without these specific details.

References in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Introduction

An embodiment of the present invention includes an algorithm that performs the constraints-based global routing step in the physical design of integrated circuits. The algorithm is based on finding routes for the entire circuit based on constraints being satisfied for the entire design. Initially, for each net, a set of possible routing solutions is determined based on applicable constraints. The possible solutions for the nets are combined to create a highly-connected "intersection graph," showing nets which "intersect," indicating that the nets share a node. Weights, based on constraints, are added to the edges of the intersection graph. Using these weights, the intersection graph is "pruned" to eliminate edges, producing a sparse graph. The intersection graph is partitioned based on constraints and performance criteria. An optimal solution is determined for each partition. The optimal solutions for the partitions are then combined to produce a global routing solution. The global routing solution is provided to a detailed router, which completes the routing for the design.

The present invention produces solutions which meet timing constraints and have overall less congestion than other possible solutions. During routing, a static two-dimensional parasitic extraction and timing analysis is performed to minimize resistance and capacitance while meeting timing constraints. In one embodiment, a 3D parasitic extraction module can be used in conjunction with the present invention to enable three-dimensional parasitic extraction between layers of the circuit design.

Figure 1:
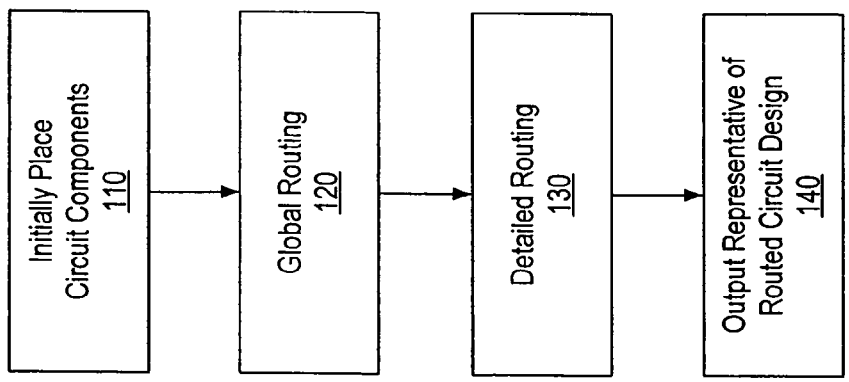
FIG. 1 is a flow diagram of an automated integrated circuit design process.

FIG. 1 is a flow diagram of an automated integrated circuit design process. Initially Place Circuit Components step 110 indicates that most routing tools used for cell-based designs begin with the placement of circuit elements, cells and/or cell blocks. Placement can be manual or automated, and typically attempts to make intelligent decisions about where connectors to the circuit elements, cells and/or cell blocks should be located, as well as how cells and/or blocks should be oriented and positioned relative to one another. Such decisions can be driven by considerations of circuit compaction, number of interconnect lines running between the blocks, and so on. With gate array designs, there is no placement step because placement has been pre-determined by the manufacturer.

Global Routing step 120 shows that the next step in completing the circuit design is typically a global routing step, which logically determines the paths for each interconnection. These decisions are made based on the available avenues formed by the current placement of circuit elements and/or blocks, and are assigned in consideration of various costs (e.g., the shortest total amount of interconnect lines between the connectors).

Once the global router has assigned the general flow of interconnect lines, in Detailed Routing step 130, a detailed router takes over and attempts to make the interconnect lines fit the assignments made by the global router. The detailed router uses the number of tracks provided for each metal layer to assign a track for each node through which the net, provided as input by the Global Routing step 120, must be routed. As shown in Output Representative of Routed Circuit Design step 140, the output of the detailed router represents the complete routed circuit design.

FIG. 2 shows a flowchart of an algorithm to perform the constraints-based global routing step in the physical design of VLSI circuits. This flowchart shows an embodiment of Global Routing step 120 according to the present invention. In Provide Floorplan Design and Constraints step 205, constraints and the output from Initially Place Circuit Components step 110 are provided to the global routing tool. The output from Initially Place Circuit Components step 110 includes a floorplan that initially places circuit components, obstructions and connectors or pins within the design. Examples of obstructions include power grids, blocks, and charge pumps. The present invention allows for routing around obstructions of any rectilinear shape, including designs having 45° and/or diagonal lines.

In 3D Graph Creation step 210, a three-dimensional graph representing the circuit design is created. In Develop Feasible Solution Set for Each Net step 220, a feasible solution set for each net is developed. In Create Intersection Graph with Weights step 230, a graph is created including the intersections of the solution sets for each net. Weights are assigned to the edges in the intersection graph to represent the constraints. In one embodiment, the intersection graph can be "pruned" to convert the highly-connected intersection graph into a more sparsely-connected graph.

In Partition Intersection Graph step 240, the intersection graph is divided into partitions. In Develop Solution for Each Partition step 250, an optimal solution for each partition is determined using, for example, linear programming techniques. When the partitions are solved one at a time, optimal solutions for each partition can be merged with previously-obtained optimal solutions for partitions. The output of Develop Solution for Each Partition step 250, with a solution for each partition, is used as input for the detailed router, as shown in Provide Output as Input for Detailed Router step 260.

One of skill in the art will recognize that each of the steps of the flowchart of FIG. 2 can be performed by a module of a global routing tool, also referred to as a global router, or by a stand-alone module working in conjunction with the global routing tool. For example, Provide Floorplan Design and Constraints step 205 can be performed by a Floor Planning and Constraint Determination module. 3D Graph Creation step 210 can be performed by a 3D Graph Creation module, Develop Feasible Solution Set for Each Net step 220 can be performed by a Net Solution Set Generation module, and Create Intersection Graph with Weights step 230 can be performed by an Intersection Graph Creation module. Partition Intersection Graph step 240 can be performed by a Graph Partition module, and Develop Solution for Each Partition step 250 can be performed by an Optimization module, also referred to as an LP solver for embodiments using linear programming techniques. Provide Output as Input for Detailed Router step 260 can be performed by an Output Provider module. The global routing tool may receive input from a user via a User Interface module, or the global routing tool may be completely automated. Each of these modules may reside on the same computer system, or the modules may be distributed across nodes of a distributed software system.

It is within the scope of the invention that at least some of these modules may be run in parallel. For example, the development of feasible solutions for each net performed by Develop Feasible Solution Set for Each Net step 220 can be performed in parallel. In an example environment having 10 computer systems available for calculating solutions sets, a design having 1,000 nets may be divided into sets of 100 nets for each computer system. The ten computer systems can find the solutions in parallel, and the resulting feasible solution sets can be passed to Create Intersection Graph with Weights step 230. If Develop Feasible Solution Set for Each Net step 220 is performed in parallel, the design can be divided such that nets that have noise between them are placed in the same set to be solved by the same computer system. In this way, noise avoidance is taken into account in developing the feasible solution sets.

In one embodiment, the solutions for each partition are placed in order of priority and solved one at a time in Develop Solution for Each Partition step 250. The previous solutions for the partitions are then used to develop solutions for subsequent partitions.

Alternatively, Develop Solution for Each Partition step 250 may be performed in parallel. A parallel approach can identify partitions that do not interact with each other, also referred to as "zero interaction cliques," for separate simultaneous solution.

Provide Floorplan Design and Constraints

The constraints for the global routing tool of the present invention are determined by design requirements. Examples of the types of constraints that can be used are listed below.

Timing Constraints. In at least one embodiment, the maximum path delay allowed for the routed net can be specified, for example, by a user of the global routing tool. In one embodiment, the maximum path delay is specified using the standard delay format. Standard Delay Format (SDF) is set forth in Standard Delay Format Specification, Version 3.0 (May 1995, Open Verilog International), which is incorporated by reference in its entirety. An SDF file is an ASCII text file containing a header section followed by one or more cell entries describing cells of the design. The header section contains information relevant to the entire file, such as the design name, tool used to generate the SDF file, parameters used to identify the design, and operating conditions. Each cell entry identifies part of the design (a "region" or "scope") and contains data for delays, timing checks, constraints, and the timing environment. For example, the launch time and edge rate at the driver pins of the nets and the required arrival time and edge rate at each sink pin of a net can be specified as timing constraints.

Noise Constraints. In at least one embodiment, the user can specify nets that should be avoided and the amount of spacing to be allowed between nets. The user can also specify whether a specified percentage of a particular net is to be routed along a power or ground signal.

Shielding Constraints. In at least one embodiment, the user can specify the shielding requirements of a net while routing. The shielding width, spacing and percentage of the net to be shielded can be specified. For example, 50% of a particular net may need to be shielded, and two tracks can be allocated along 50% of the length of that net to provide the necessary shielding.

Cell Insertion Constraints. In at least one embodiment, cell insertion constraints can be specified by the user along with the original timing constraints. Limits can be specified for a maximum transition time or maximum delay allowed such that a repeater or latch can be inserted to overcome the limit. For example, in a path from a driver D1 to a sink S1, a repeater R1 can be inserted between D1 and S1 such that there is a topological breakpoint in the path from D1 to S1. The path from D1 to S1 includes two sub-paths: a sub-path from D1 to R1, and a sub-path from R1 to S1. In such a case, noise constraints must be considered independently for the sub-path from D1 to R1 and the sub-path from R1 to S1.

Figure 3B:
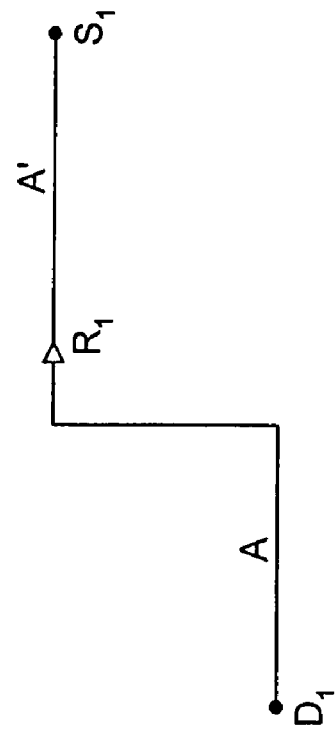
FIG. 3b shows a circuit resulting from cell insertion, which must be taken into account when routing.
Figure 3A:
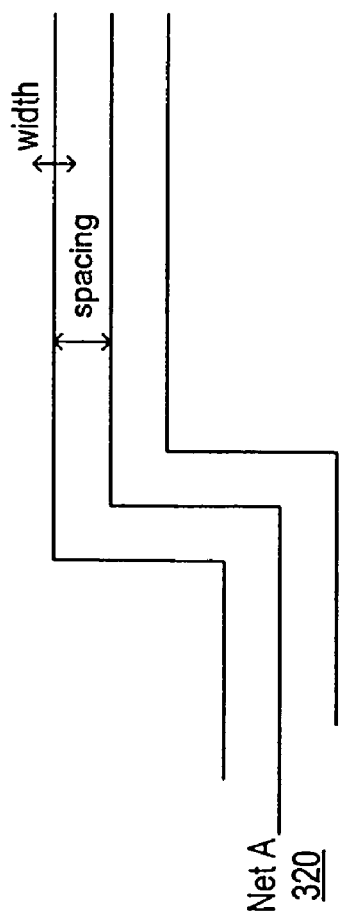
FIG. 3a shows a minimum spacing between nets to ensure that no noise is transferred generally or to one or more specific nets.

FIGS. 3a and 3b show constraints that are taken into account by the global routing tool of the present invention. For example, to avoid noise between nets, a minimum spacing between nets can be established to ensure that no noise is transferred generally or to one or more specific nets, as shown in FIG. 3a. Furthermore, a given net, such as Net A 320, may need to be routed outside a given width of an adjacent power or ground rail, referred to as "shielding," for inductance prevention.

FIG. 3b shows a circuit resulting from the insertion of repeater cell R1 into a path from driver $D_1$ to sink $S_1$. The original path from driver $D_1$ to sink $S_1$ is divided into two portions, A and A'. For example, a cell may be inserted to speed up timing to achieve a certain rise time to drive capacitance. The added cell R1 must be routed around during the routing process.

3D Graph Creation

To create a three-dimensional graph of the design, the entire design area is divided into a grid, and each grid section is assigned a "gtile." Gtiles are usually square and one node, also referred to herein as a gNode, of a gtile exists in a given area per layer.

Figure 4B:
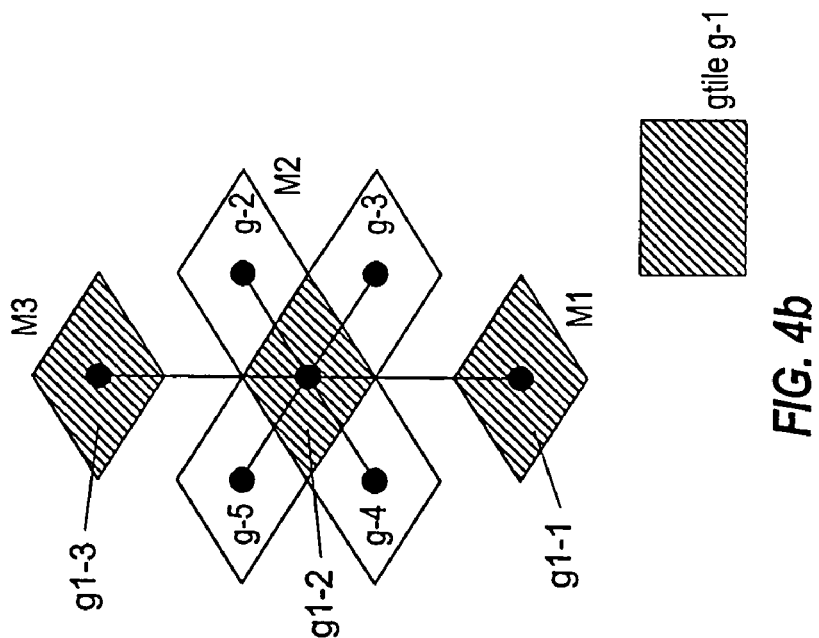
FIG. 4b shows three layers of an integrated circuit design and relationships between gtiles in the three layers.
Figure 4A:
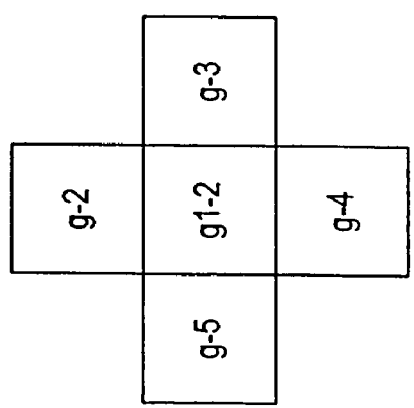
FIG. 4a is a diagram of a single metal layer of an integrated circuit design divided into gtiles.

FIG. 4a is a diagram of a single metal layer of an integrated circuit design divided into gNodes. Five gNodes labeled g1-2, g-2, g-3, g-4 and g-5 are shown. A given gNode, such as gNode g1-2, is considered to be connected to each of its neighbors. GNode g1-2 is connected to each of neighbors g-2 through g-5.

FIG. 4b shows three layers of an integrated circuit design and relationships between gNodes in the three layers. The five gNodes of FIG. 4a are shown as part of metal layer M2 in FIG. 4b. In addition, FIG. 4b shows gNode g1-1 in metal layer M1 and gNode g1-3 in metal layer M3. A collection of gNodes in a vertical relationship between metal layers of the circuit is referred to herein as a "gtile," and the shaded portions of FIG. 4b correspond to a gtile g-1. Each gtile has a gNode for each of its metal layers; for example, gtile g-1 includes gNode 1-1 in metal layer M1, gNode 1-2 in metal layer M2, and gNode 1-3 in metal layer M3. All the gNodes of a gtile are connected to each other by a neighbor relationship.

In the three-dimensional graph shown in FIG. 4b, vertical neighbors are gNodes of the same gtile, and horizontal neighbors are gNodes of the same metal layer but adjoining gtiles. The graph is referred to herein as a global routing graph or gGraph. A gNode has a maximum of six neighbors, four horizontal neighbors and two vertical neighbors.

3D Graph Creation step 210 also adds obstructions, which may be of various rectilinear shapes, into the design that must be routed around in forming interconnections between circuit components. These obstructions may represent power grids, blocks, and charge pumps. The three-dimensional graph enables modeling of congestion of the interconnect lines between connectors, taking into account these obstructions.

Develop Feasible Solution Set for Each Net

For each gtile, the number of routing tracks available through the gtile is calculated. The calculation takes into account previously routed nets and design-wide obstructions. If a neighbor is obstructed completely, no connection to that neighbor is made in the final circuit design. Pins from the netlist, if located in a certain gNode, are attached to that particular gNode. If a net will require more than one track to be routed on a particular metal layer, the number of tracks is taken into account when routing the net.

The global route for a net is defined by mapping the net onto a set of gtiles. The present invention is used to produce a unique gtile map, together with width and spacing, for the nets such that all the global and individual net constraints are met.

As earlier described with regard to FIG. 1, a floor planning module places circuit blocks of the design into sections. The floor planning module also identifies where the drivers and sinks are located by gNode. A global router identifies through which of the sections the gNodes and sinks will be connected; in other words, the global router develops a map at a coarse level. A detailed router uses information about the number of tracks for each metal layer to assign a track for each gNode through which the net must be routed (as determined by the global router). In some embodiments, the floor planning module is a third-party module provided by a vendor independent of the global routing tool vendor, and in other embodiments, the floor planning module can be a component of the global routing tool provided by the same vendor.

Figure 5:
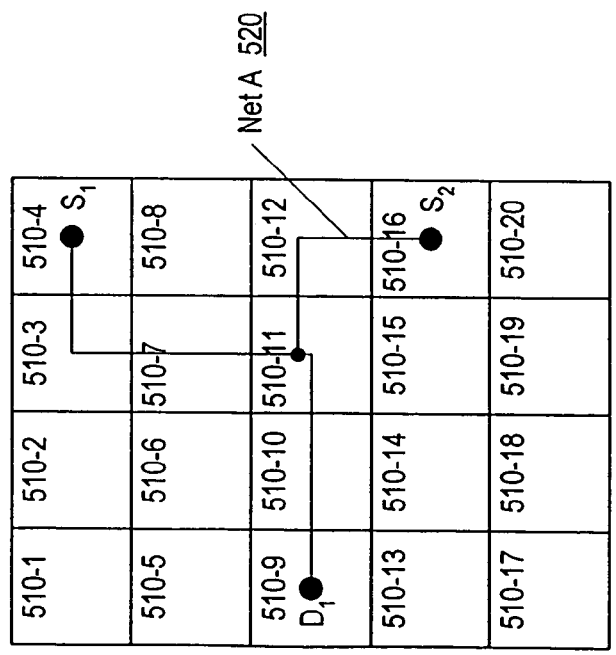
FIG. 5 shows an example of two paths, with one path spanning multiple layers of a circuit design.

FIG. 5 shows an example of a floorplan that is output from the floor planning component This example floorplan includes two paths having multiple nodes of two metal layers. A first path includes a driver $D_1$ and a sink $S_1$ as pins in metal layer 3. A second path includes driver $D_2$ and a sink $S_{2b}$ as pins in metal layer 2, and sink $S_{2a}$ in metal layer 3 (see FIG. 7b). Obstruction $O_1$ appears in metal layer 2 and obstruction $O_2$ appears in metal layer 3 (not shown in FIG. 5).

An obstruction, such as obstruction $O_1$ or $O_2$, indicates that tracks in the gtile map are "removed," or considered to be unavailable, such that a net should not be routed through the corresponding gNode of the gtile. As mentioned earlier, examples of obstructions include power grids, blocks, and charge pumps. The present invention allows for obstructions in the form of any rectilinear shape.

Figure 6:
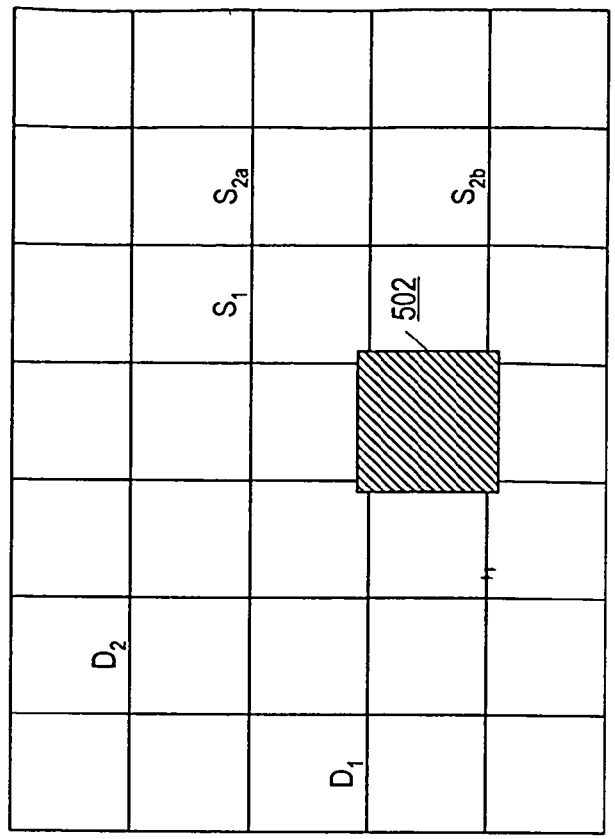
FIG. 6 shows an example of an obstruction of an arbitrary rectilinear shape that can routed around in a global routing produced according to the present invention.

FIG. 6 shows an example of a rectilinear obstruction 502 that can be routed around when using the global routing tool of the present invention. Unlike currently available global routing tools, the present invention enables obstructions of any rectilinear shape to be routed around, including obstructions having diagonal lines such as obstruction 502.

Figure 7B:
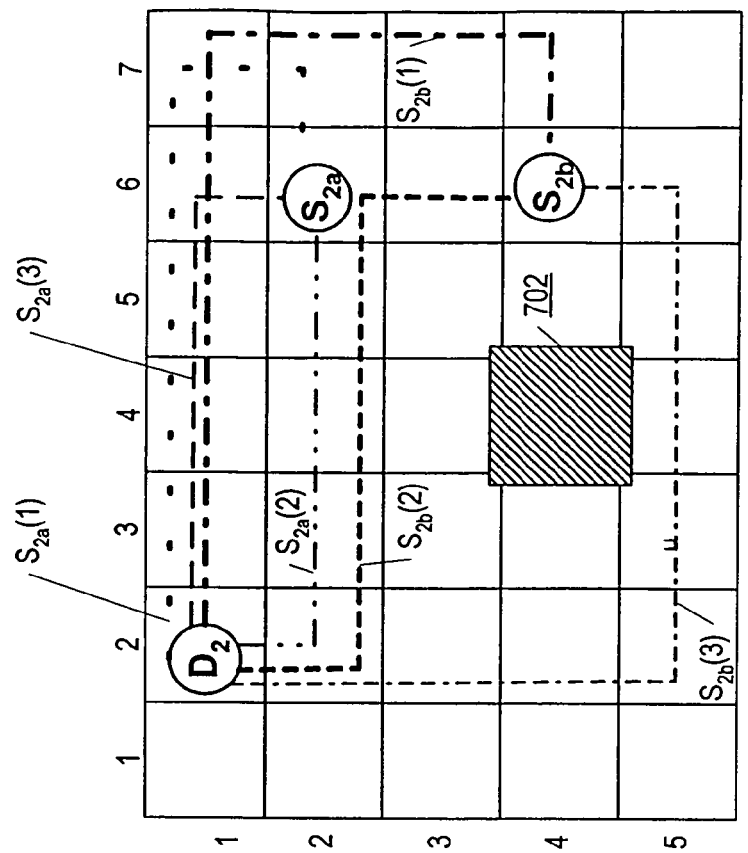
FIG. 7b shows driver $D_2$ of FIG. 5 with two sinks $S_{2a}$ and $S_{2b}$.
Figure 7A:
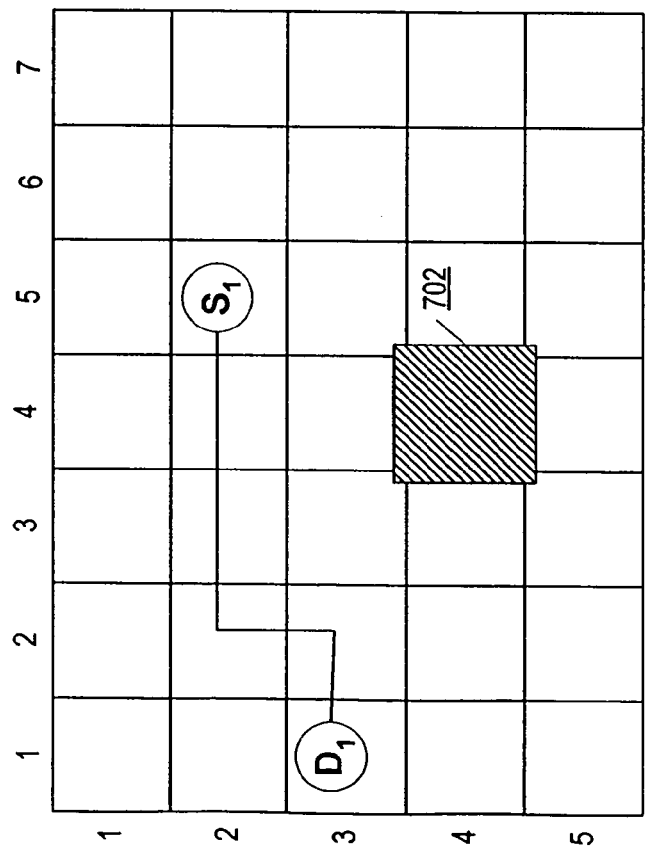
FIG. 7a shows a solution for a route between driver $D_1$ and sink $S_1$ of the gtile map shown in FIG. 5.

FIG. 7a shows an example of a gNode map for a given metal layer. The gtile map is produced by the global routing tool of the present invention. Ultimately, the global routing tool produces a unique gtile map for each net that meets all constraints and for which routing is both feasible and minimal. The width of the net is taken into account for global routing purposes.

FIG. 7a shows a solution for a route between driver $D_1$ and sink $S_1$ of the gtile map shown in FIG. 5. The route begins at driver $D_1$ in row 3 column 1 of the gtile map and proceeds to row 3 column 2. The route then proceeds from row 3 column 2 to row 2 column 2. The route then proceeds through row 2 column 3 to row 2 column 5, which includes sink $S_1$.

As mentioned above, an obstruction, such as obstruction 702, indicates that tracks in the gtile map are "removed," or considered to be unavailable, such that a net should not be routed through the corresponding gNode of the gtile. Any route excluding row 4, column 4, which contains obstruction 702, can be taken between driver $D_1$ and sink $S_1$.

In creating a feasible solution set for a net, each route placed into the solution set should be feasible and meet applicable constraints. If no solutions exist for routing the net, a design flaw exists and the floorplan must be changed. If one solution exists, that solution corresponds to the solution set. If several solutions exist, a subset of the solutions can be selected to form the solution set; for example, a maximum of three solutions may be selected to form the solution set based on, for example, metrics for timing quality and length.

In FIG. 7b, driver $D_2$ of FIG. 5 is shown, with two sinks $S_{2a}$ and $S_{2b}$. A solution for a route between $D_2$ and $S_{2a}$ is determined independently of the solution for a route between $D_2$ and $S_{2b}$. Three solutions are illustrated for the path from $D_2$ to $S_{2a}$, respectively labeled $S_{2a}(1)$, $S_{2a}(2)$ and $S_{2a}(3)$. Similarly, three solutions are illustrated for the path from $D_2$ to $S_{2b}$, respectively labeled $S_{2b}(1)$, $S_{2b}(2)$ and $S_{2b}(3)$. These solutions are then combined to provide the following 9 possible solutions for nets including $D_2$, $S_{2a}$ and $S_{2b}$:

| | | |
|---|---|---|
| $S_{2a}(1), S_{2b}(1)$ | $S_{2a}(1), S_{2b}(2)$ | $S_{2a}(1), S_{2b}(3)$ |
| $S_{2a}(2), S_{2b}(1)$ | $S_{2a}(2), S_{2b}(2)$ | $S_{2a}(2), S_{2b}(3)$ |
| $S_{2a}(3), S_{2b}(1)$ | $S_{2a}(3), S_{2b}(2)$ | $S_{2a}(3), S_{2b}(3)$ |

A set of global route solutions for each net is generated. In one embodiment, Mikami Line Search Algorithm is used for finding these solutions. For more information regarding Mikami Line Search Algorithm, see K. Mikami and K. Tabuchi, *A Computer Program for Optimal Routing of Printed Circuit Connectors*, IFIPS Proceedings, H47: 1475–1478, 1969, which is incorporated herein by reference.

The Mikami Line Search algorithm searches across obstacles and multiple metal layers to find routing paths. For each net, each of its sink pins is paired with the driver pin to form (driver, sink) pairs for each path. Each path is routed using the Mikami Algorithm and multiple solutions are generated per path. After all solutions have been found for each (driver, sink) pair, the solutions are merged to give solutions for the entire net. For example, if a net had two paths, then two (driver, sink) pairs are formed. If the search algorithm generated three possible solutions for the first pair and two possible solutions for the second pair, then six global route solutions are possible for the net. The delay and actual length for each path solution is computed and stored for further analysis in the routing process.

Mikami Tabuchi algorithm, a line probe algorithm, is designed to perform better than maze routing algorithms, both in terms of route search time and quality. Maze routing algorithms search grid nodes in a breadth-first fashion, whereas a line probe algorithm searches line segments available within the three-dimensional gmap. The time and space complexity of Mikami Tabuchi algorithm is O(L), where L is the number of line segments produced to complete the route search. Mikami Tabuchi algorithm finds a path between driver and sink, if such a path exists, and assures that the path found is the shortest path available on the given floorplan. Initially, the line probes are drawn from both driver and sink in mutually perpendicular directions. These lines extend until reaching the floorplan boundary or an obstacle on that metal layer. If these lines do not intersect, then at each grid point on these lines, perpendicular lines are drawn until they reach the boundary of the floorplan or hit an obstacle. This process is continued recursively until an intersection point is found between the list of lines belonging to the driver and sink.

To enable multi-layer routing, the lines drawn from points on a previous line can be on multiple layers, thereby reducing the overall search time. In practice, new lines are not drawn from every grid point on the previous line. A spacing factor between grid points is used to reduce the exponential growth in number of lines generated during a complicated search.

More sophisticated algorithms, such as Steiner Tree-based approaches, can be used to determine routes more suitable for multi-terminal nets. For more information about Steiner trees, see C. Chieng, M. Sarrafzadeh & C. K. Wong, *A Powerful Global Router Based on Steiner Min-Max Trees*, Proceedings of IEEE International Conference on Computer-Aided Design, pp. 2–5, Nov. 7–10, 1989, which is herein incorporated by reference.

Steiner Tree-based approaches are based on first finding the minimum spanning tree for the given set of pins on a net. A minimum spanning tree is a minimum-weight tree in a weighted graph which contains all of the graph's vertices (here, all the pins). From the minimal spanning tree, a rectilinear Steiner Tree is produced. A Steiner Tree is a tree resulting when, given a set of vertices S in an undirected weighted graph, a minimal weight spanning tree of S∪Q is produced for some added Steiner vertices Q in the graph. A Steiner tree differs from the minimum spanning tree in that the set of Steiner vertices must be identified. That is, additional vertices may be used. A Steiner Tree is based on rectilinear projections of the edges of this minimum spanning tree.

Once a set of solutions for each net is produced, the solutions for each net can be pruned according to delay and length constraints. In one embodiment, Elmore Delay is computed for each path of the net. For more information about Elmore Delay, see W. C. Elmore, *The Transient Response of Damped Linear Networks with Particular Regard to Wideband Amplifiers*, Journal of Applied Physics, vol. 19(1), 1948; and J. Rubenstein, P. Penfield, Jr. and M. A. Horowitz, *Signal Delay in RC Tree Networks*, IEEE Transactions on Computer Aided Design, CAD-2:202–211, 1983, each of which is incorporated herein by reference.

The Elmore Delay model is the most commonly used delay model in works on interconnect design when inductance and distributed resistance and capacitance (RC) effects don't dominate. Under the Elmore delay model, the signal delay from the driver s0 to a given node i in an RC tree is calculated as follows:

$$t(s0, i) = \text{Sum\_over\_all\_nodes}\_k(R(ki)*C(k))$$

where $C(k)$ is the downstream capacitance from node i $R(ki)$ is the resistance at node i All nodes and sinks in the RC tree have a different delay. In general, the Elmore delay of a sink in an RC tree is a (loose) upper bound on the actual 50% delay of the sink under step input.

Elmore delay provides a simple closed-form expression with greatly improved accuracy for measuring delay, when compared to other RC models. Furthermore, the Elmore delay calculation can be done in linear time. The Elmore delay model is not the most accurate delay model available, but the Elmore delay model has a high degree of fidelity: an optimal or near-optimal solution according to the estimator is also nearly optimal actual delay for routing constructions and wire-sizing optimization. Other delay models which are more accurate can be used, but run-time for these models is usually greater than that of the Elmore delay model.

Using the arrival time constraints, the delay violation for each path solution is computed using the following formula:

$$\text{Delay Violation} = \text{Actual Delay} - \text{Arrival Time Constraint}$$

A value of 0 for the delay violation indicates that the arrival time constraint is met. A positive value indicates that the arrival time constraint is not met, and a negative value means that slack is available for optimization of other nets. The net solutions where all the paths of the net meet the constraint (delay) are retained, and the rest of the solutions are omitted from further consideration for inclusion in the final global routing solution. This "pruning" of the solutions guarantees that the ultimate global routing solution meets the timing constraint.

In one embodiment, feasible solutions sets are determined in order of priority. Consider a design having twenty nets. When the solution for the first net is developed, multiple solutions are available. After the first ten nets' solutions are developed, available tracks for routing the eleventh net are limited. Assume that the eleventh net interacts with eight other nets, four of which have already been routed as part of the first ten nets. Noise should be avoided between the interacting nets, and the topology of the previously routed nets can be considered to be an obstruction for the route of the eleventh net.

In the example, assume that the eleventh net needs to be a distance of four tracks from the previously routed tenth net. A temporary obstruction can be constructed determined by the topology of the tenth net. The eleventh net can be routed to automatically avoid the temporary obstruction. When the routing for the eleventh net is complete, the temporary obstruction can be removed for routing of subsequent nets. This approach of routing nets in order of priority and using temporary obstructions enables spacing constraints and noise to be taken into account.

Figure 8:
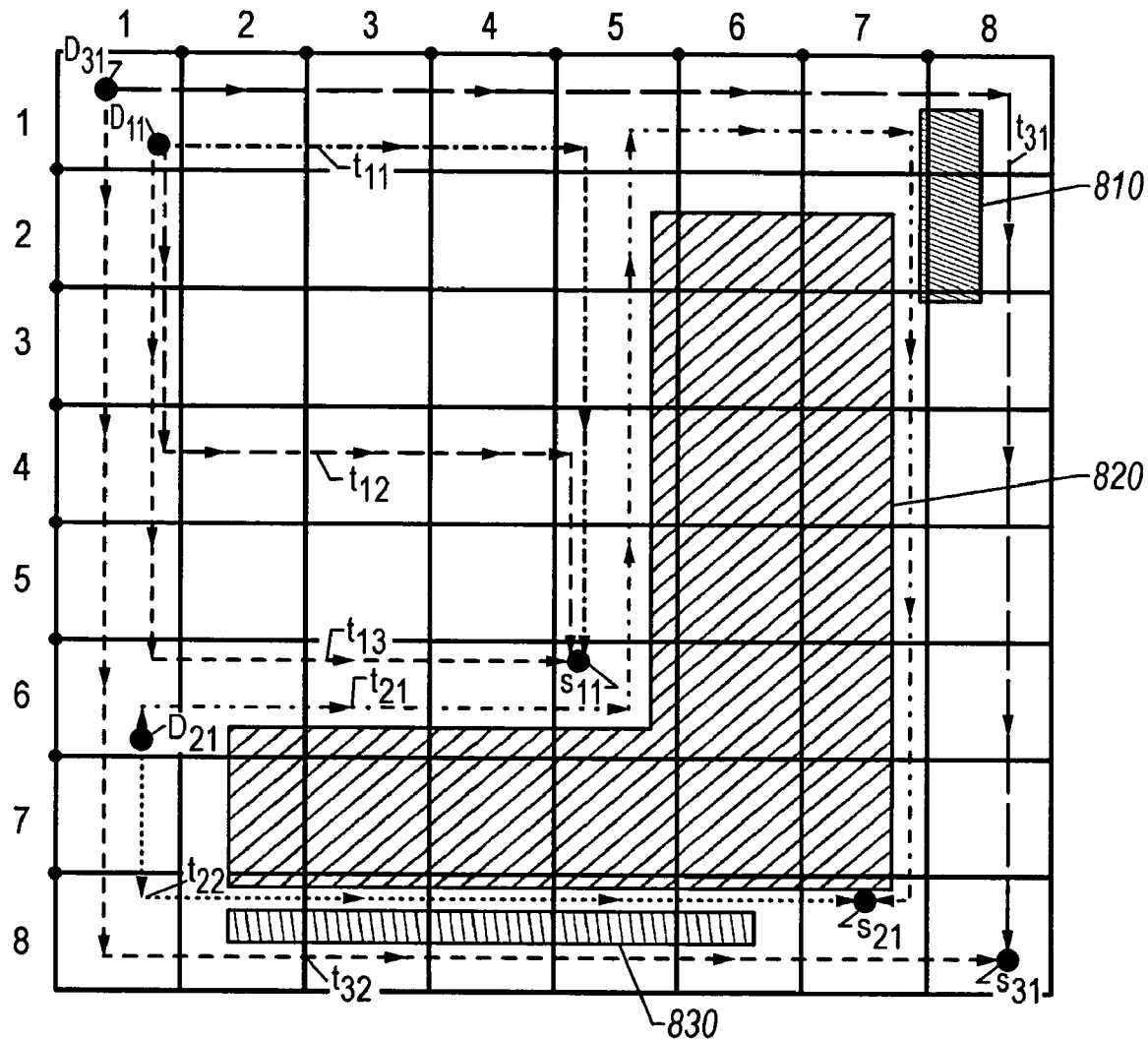
FIG. 8 shows alternative routing solutions for multiple drivers and sinks according to an embodiment of the present invention.

FIG. 8 shows an example of a design including three drivers and three sinks in a single metal layer. The method of the present invention will be applied to the example design of FIG. 8 in the following sections.

FIG. 8 includes three nets: N1, beginning at driver $D_{11}$ and ending at sink $S_{11}$; N2, beginning at driver $D_{21}$ and ending at sink $S_{21}$; and N3 beginning at driver $D_{31}$ and ending at sink $S_{31}$. Three obstructions 810, 820 and 830 are also present. Note that tracks are free in rows 6 and 8 and columns 7 and 8 such that paths can be routed through the gNodes of rows 6 and 8 and columns 7 and 8 despite obstructions 810 and 830. Obstruction 820 completely obstructs column 6 rows 2–7 and row 7 columns 2–6, and no path can be routed in column 6 rows 2–7 or row 7 columns 2–6. Taking these obstructions into account, feasible paths can be identified using algorithms such as those described above.

For net N1, three possible paths include path $t_{11}$ (also referred to as topology$_{11}$), $t_{12}$ and $t_{13}$. For net N2, two possible paths include $t_{21}$ and $t_{22}$. For net N3, two possible paths include paths $t_{31}$ and $t_{32}$. Note that paths $t_{11}$, $t_{12}$ and $t_{13}$ meet at sink $S_{11}$. For the design to include all three paths, a separate track must be available for each path.

The result of steps Create 3D Graph step 210 and Develop Feasible Solution for Each Net step 220 of FIG. 2 is summarized below.

3 nets: N1, N2 and N3

Number of solutions for each net: N1 has 3, N2 has 2, N3 has 2.

Create Intersection Graph with Weights

In Create Intersection Graph with Weights step 230 of FIG. 2, finding a best solution from one point to another can be performed using known techniques. In most global routing tools, a single best solution is considered for each net. Using the best solution for each net, the netlist is updated and a new net is identified from the set of solutions including only one best solution for each net.

In contrast, the present invention considers a set of solutions, rather than the single best solution, for each net. Each solution for a given net is determined independently of other nets that do not have noise interaction with the given net. As an initial condition, the set of feasible solutions is constrained by the total number of tracks available in view of obstructions, but not by other feasible solutions for other nets that may need to use those tracks. The best set of feasible solutions is determined to include only solutions that are feasible for the entire set of nets.

Based on these sets of solutions for each net, an intersection graph for the entire netlist is created. Each net is represented as an intersection graph node. If the gNodes forming the solutions intersect with solutions of another net, an undirected edge is formed between the two intersection graph nodes. These edges are weighted based on the interactions between the intersection graph nodes. In order to distinguish the nodes of gmap from intersection graph nodes, the term "gNode" or "node" is used for gmap nodes, and the term "intersection graph node" is used for the nodes of the intersection graph.

Figure 9:
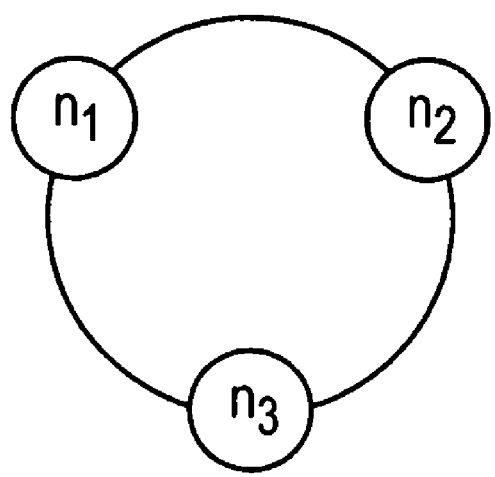
FIG. 9 shows an example of an intersection graph in which nets N1, N2, and N3 of FIG. 8 are connected to each other.

FIG. 9 shows an example of an intersection graph in which nets N1, N2 and N3 of FIG. 8 are included. An edge is placed between intersection graph nodes of the intersection graph N1 and N2 because nets N1 and N2 share the gNodes including driver $D_{21}$ and sink $S_{11}$, as well as the gNodes in row 6 columns 3 and 4 and column 5 rows 1 through 6. An edge is placed between nodes of the intersection graph N1 and N3 because nets N1 and N3 share the gNodes including driver $D_{11}$ and $D_{31}$, as well as the gNodes including column 1 rows 1 through 6 and row 1 columns 1 through 4. An edge is placed between nodes of the intersection graph N2 and N3 because nets N2 and N3 share the gNodes including row 8 columns 1 through 7.

In one embodiment, the edges are weighted by the percentage of solutions of two nets that intersect and the average probable congestion over intersecting gNodes. For example, the weight on the edge between two nodes (representing 2 different nets in the design) can be a function of the number of intersecting solutions and congestion, as shown in the formula below:

$$=y*(A_{NaNb})+(1-y)*B_{NNb}$$

where $A_{NaNb}$ (representing Intersecting Solutions)=(#solutions intersecting between $N_a$ & $N_b$)*(Avg. over all intersecting pairs of the % of gNodes intersecting)

$B_{NaNb}$ (representing Congestion)=(#nodesSharedAndCongested/#nodesShared between all solutions for $N_a$ & $N_b$)*Average Congestion on nodesSharedAndCongested where congestion=

$$\text{congestion} = \left(\frac{\text{\# tracks used}}{\text{\# tracks Available}}\right)$$

Assume that one or more obstructions in a particular gNode of the gmap of FIG. 8 consume all but one track running through each gNode including the obstructions. Therefore, a gNode of FIG. 8 including one or more obstructions has only one track available for routing.

Typically, a path running through a gNode needs one track. However, a path may be wider, requiring two or more tracks, for example, to avoid noise. A gNode is considered to be congested when the value of congestion, as calculated above, is greater than one. Therefore, when a given gNode of FIG. 8 has one or more obstructions and more than one path is routed through the given gNode, the given gNode is considered to be congested.

Using the percentage of solutions of two nets that intersect and the average probable congestion over intersecting gNodes, a single weight for each edge is determined. Calculations of weights for the intersection graph of FIG. 9, representing the design shown in FIG. 8, are shown below.

Referring to FIG. 8 and the paths for nets N1 and N2, all three paths for net N1 intersect with path $t_{21}$ from net N2. For example, path $t_{11}$, having a length of ten gNodes, intersects with path $t_{21}$, having a length of 19 gNodes. The intersection shares the six gNodes in column 5 rows 1 through 6. The percentage of gNodes intersecting between path $t_{11}$ and path $t_{21}$ is calculated below:

$$(t_{11} \text{ with } t_{21}) = \frac{1}{2} * \left(\frac{6}{10} + \frac{6}{19}\right) = 0.46$$

Similarly, path $t_{12}$, having a length of ten gNodes, intersects with path $t_{21}$, having a length of 19 gNodes, with the intersection including the three gNodes in column 5 rows 4 through 6. The percentage of gNodes intersecting between path $t_{12}$ and path $t_{21}$ is calculated below:

$$(t_{12} \text{ with } t_{21}) = \frac{1}{2} * \left(\frac{3}{10} + \frac{3}{19}\right) = 0.23$$

Path $t_{13}$, having a length of ten gNodes, intersects with path $t_{21}$, having a length of 19 gNodes, with the intersection including the five gNodes in row 6 columns 1 through 5. The percentage of gNodes intersecting between path $t_{13}$ and path $t_{21}$ is calculated below:

$$(t_{13} \text{ with } t_{21}) = \frac{1}{2} * \left(\frac{5}{10} + \frac{5}{19}\right) = 0.38$$

Using these calculations, the average over the three intersecting pairs of the percentage of gNodes intersecting is calculated below:

$$\frac{1}{3}[0.46 + 0.23 + 0.38] = 0.36$$

This average is used as part of the formula for $A_{NaNb}$, representing intersecting solutions, to assign weights to the edges between the nodes of the graph of FIG. 9. The weight assigned to the edge between nets N1 and N2 is calculated as shown below:

$w_1(N1 \leftrightarrow N2) = y*A_{N1N2} + (1-y)*B_{N1N2}$ $A_{N1N2}$=number of solution pairs intersecting*Avg. over all intersecting pairs of the percentage of gNodes intersecting

3*(0.36)=1.08

In the formula for $A_{N1N2}$, representing congestion, the number of congested gNodes is used as part of the calculation. Recall that when a gNode has one or more obstructions, the obstructions are considered to occupy all but one track running through the corresponding gNode. As a result, gNodes with two paths and one or more obstructions in FIG. 8 are congested, including the gNodes in column 5, rows 2 through 6; row 6, columns 2 through 5; and row 8, columns 2 through 6.

$B_{NaNb}$ (representing Congestion)=(#nodesSharedAnd-Congested/#nodesShared between all solutions for $N_a$ & $N_b$) Average Congestion on nodesSharedAndCongested where congestion=

$$\text{congestion} = \left(\frac{\text{\# tracks used}}{\text{\# tracks Available}}\right)$$

Ten gNodes are shared between nets N1 and N2, including the six gNodes in column 5, rows 1 through 6, and the four gNnodes in row 6, columns 1 through 4. (Note that the gNode of row 6, column 5, was already counted in the five gNodes for column 5.) Of the ten gNodes shared by nets N1 and N2, the five gNodes of column 5, rows 2 through 6, are congested. Each of the five congested gNodes has a value for congestion=2 tracks used/1 track available=2. The average congestion for gNodes shared and congestion is therefore (5*2)/5=2.

Therefore, $A_{N1N2}$ is calculated as shown below:

$$\frac{5}{10} * ((5*2)/5) = 1.0$$

Figure 10:
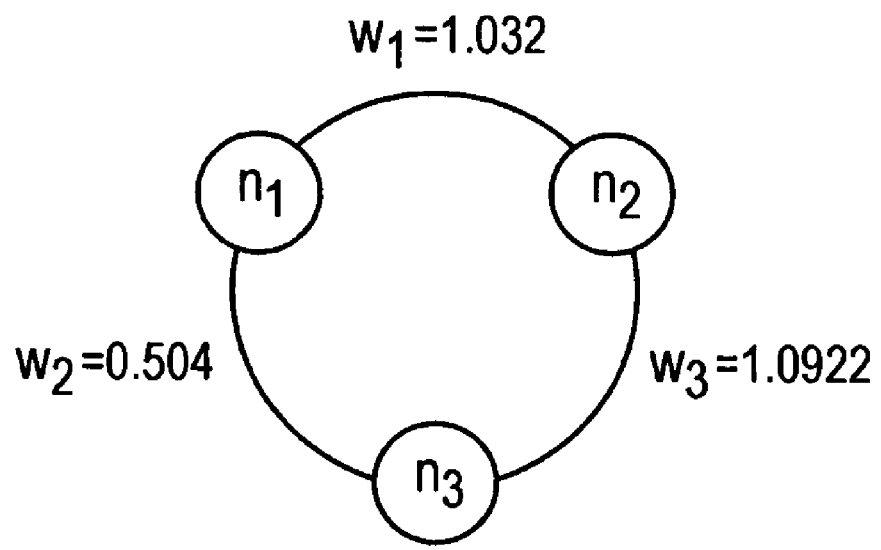
FIG. 10 shows an example of a weighted intersection graph according to an embodiment of the present invention.

Using this result, the weight for the intersection graph edge between N1 and N2 is calculated as shown below:

$w_1(N1 \leftrightarrow N2) = y*A_{N1N2} + (1-y)B_{N1N2}$ $w_1(N1 \leftrightarrow N2) = (y=0.4)*(A_{N1N2}=1.08) + ((1-y)=0.6)*(B_{N1N2}=1.0) = 0.4*1.08 + 0.6$ $w_1(N1 \leftrightarrow N2) = 1.032$ As shown in FIG. 10, the weight of the edge between nets N1 and N2 has a value of 1.032.

To calculate the weight for the edge between nets N1 and N3, the calculations below are used:

$w_2(N1_1 \leftrightarrow N3) = y*A_{N1N3} + (1-y)*B_{N1N3}$

Between nets N1 and N3, path $t_{31}$ intersects with path $t_{11}$ at the five gNodes in row 1 columns 1 through 5. Path $t_{31}$ has fifteen gNodes, and path $t_{11}$ has ten gNodes.

$$(t_{31} \text{ with } t_{11}) = \frac{1}{2}\left(\frac{5}{15} + \frac{5}{10}\right) = 0.42$$

Between nets N1 and N3, path $t_{32}$ intersects with path $t_{12}$ at the four nodes in column 1 rows 1–4. Path $t_{32}$ has fifteen gNodes, and path $t_{12}$ has ten gNodes.

$$(t_{32} \text{ with } t_{12}) = \frac{1}{2}\left(\frac{4}{15} + \frac{4}{10}\right) = 0.33$$

Between nets N1 and N3, path $t_{32}$ intersects with path $t_{13}$ at the six gNodes in column 1 rows 1–6. Path $t_{32}$ has fifteen gNodes, and path $t_{13}$ has ten gNodes.

$$(t_{32} \text{ with } t_{13}) = \frac{1}{2}\left(\frac{6}{15} + \frac{6}{10}\right) = 0.5$$

Using these calculations, the average over the three intersecting pairs of the percentage of gNodes intersecting is calculated below:

$$\frac{1}{3}[0.42 + 0.33 + 0.5] = 0.42$$

These figures are used to assign weights to the edges between the nets N1 and N3 of the graph of FIG. 9, as shown below:

$w_2(N1 \leftrightarrow N3) = y*A_{N1N3} + (1-Y)B_{N1N3}$ $A_{N1N3}$=number of solution pairs intersecting*Avg. over all intersecting pairs of the percentage of gNodes intersecting

3*(0.42)=1.26

Of the gNodes shared between nets N1 and N3, no nodes are congested.

$B_{N1N3}$=(#nodesSharedAndCongested/#nodesShared)*
Average Congestion on nodesSharedAndCongested $$\frac{0}{6}[0] = 0$$

$w_2(N1\leftrightarrow N3)=y*A_{N1N3}+(1-y)B_{N1N3}=0.4*1.26+0.6*0$
$=0.504$

As shown in FIG. 10, the weight for the edge between nets N1 and N3 has a value of 0.504.

To calculate the weight for the edge between nets N2 and N3, the calculations below are used:

$w_3(n_2\leftrightarrow n_3)=y*A_{N2N3}+(1+y)*B_{N2N3}$

Between nets N2 and N3, only two paths intersect. Path $t_{31}$ intersects with path $t_{21}$ at the three nodes in row 1, columns 5 through 7. Path $t_{31}$ has fifteen gNodes, and path $t_{21}$ has nineteen gNodes.

$$(t_{31} \text{ with } t_{21}) = \frac{1}{2}\left(\frac{3}{15} + \frac{3}{19}\right) = 0.18$$

Between nets N2 and N3, path $t_{32}$ intersects with path $t_{22}$ at the nine nodes in column 1 rows 6 through 7 and row 8 columns 1 through 7. Path $t_{32}$ has fifteen gNodes, and path $t_{12}$ has nine gNodes.

Using these calculations, the average over the two intersecting pairs of the percentage of gNodes intersecting is calculated below:

$$(t_{32} \text{ with } t_{22}) = \frac{1}{2}\left(\frac{9}{15} + \frac{9}{9}\right) = 0.8$$

$$\frac{1}{2}[0.18 + 0.8] = 0.49$$

These figures are used to assign weights to the edges between the nets N2 and N3 of the graph of FIG. 9.

$w_3(N2\leftrightarrow N3)=y*A_{N2N3}+(1-y)*B_{N2N3}$ $A_{N2N3}$=number of solution pairs intersecting*Avg. over all intersecting pairs of the percentage of gNodes intersecting

2*(0.49)=0.98

Twelve gNodes are shared between nets N2 and N3, including the three gNodes in columns 1, rows 6 through 8; the six gNodes in row 8, columns 2 through 7; and the three gNodes in row 1, columns 5 through 7. Of these twelve shared gNodes, seven gNodes are congested, including the five gNodes in row 8, columns 2 through 6 and the two gNodes in column 7, rows 1 and 2. Recall that, even when a gNode has more than one obstruction, one track is considered to be available in this example. Therefore, the value of congestion for each of the seven gNodes is 2, because each of these seven gNodes has two paths used but only one track available.

$B_{N2N3}$=(#nodesSharedAndCongested/#nodesShared)*
Average Congestion on nodesSharedAndCongested $$\frac{7}{12} * \frac{(7*2)}{7} = 1.167$$

The weight for the edge is then calculated as follows:

$w_3(N2\leftrightarrow N3) = .4*0.98 + .6*1.167 = 0.392 + 0.7002 = 1.0922$

As shown in FIG. 10, the weight of the edge between nets N2 and N3 has a value of 1.0922.

Depending on whether congestion or timing is the higher priority, this weight can be adjusted by adjusting the value of the variable y. In addition, if noise is a constraint, then a weighting factor for noise avoidance can be added to the intersection graph.

After all solution sets are placed, the intersection graph becomes a highly-connected graph for an average congested design. As noted above, the highly-connected intersection graph can be pruned to produce a sparse graph before proceeding.

Partition Intersection Graph

In Partition Intersection Graph step 240 of FIG. 2, the intersection graph produced by Create Intersection Graph with Weights step 230 optionally can be partitioned using known graph partitioning techniques. The purpose of the partitioning is to minimize the time necessary to find an optimal solution for each partition. Standard linear programming techniques, for example, can be used to perform the optimization, although the number of variables that can be used is limited. To solve the optimization problem within a reasonable computer processing time, the highly-connected intersection graph is divided into partitions. The graph is partitioned such that an optimization module, such as a standard linear programming solver, can be used to analyze each partition in a minimal computer processing time.

Partitioning takes as input the intersection graph of nets and gives as output a set of partitions. Partitions can be made such that nets within a partition have a high degree of interaction between them, and nets in different partitions have a lower degree of interaction.

In one embodiment, an initial partition is made and then refined using Fiduccia Mattheyses (FM) refinement. For more information regarding FM refinement, see C. M. Fiduccia & R. M. Mattheyes, *A Linear Time Heuristic for Improving Network Partitions*, Proceedings of the 19th Design Automation Conference, pp. 175–181, 1982. Initial partitioning uses a greedy heuristic algorithm to distribute nets between the partitions keeping the constraint of lower and upper bounds on the number of nets per partition. FM refinement performs k-way partitioning using the FM heuristic.

A circuit netlist is usually modeled by a hypergraph G, where V is the set of cells (also called nodes) in the circuit, and E is the set of nets (also called hyperedges). The number of nodes is designated by the variable n and the number of nets by the variable e. Each net connects two or more cells in the circuit. A net $n_i$ is represented as a set of the cells are connected via the net. A two-way partition of G is two disjoint subsets $V_1$ and $V_2$ such that each cell v that is an element of V belongs to either $V_1$ or $V_2$. A net is said to be cut if it has at least one cell in each subset and uncut otherwise, and this concept is referred to as the cutstate of the net. All the nets that are cut form a set called the cutset. The objective of a two-way partitioning is to find a partition that minimizes the size of the cutset (called the cutsize). Usually, a predetermined balance criterion exists for the size of the subsets $V_1$ and $V_2$; for example, $0.45 <= |V_i|/|V| <= 0.55$, where $i=1,2$.

The FM algorithm starts with a random initial partition. Each cell u is assigned a gain g(u) which is the immediate reduction in cutsize if the cell is moved to the other subset of the partition:

$g(u) = \Sigma c(n_i) - \Sigma c(n_j)$ $n_i \in E(u)$ $n_j \in I(u)$ where E(u) is the set of nets that will be immediately moved out of the cutset on moving cell u, and I(u) is the set of nets that will be newly introduced into the cutset. Put in another way, a net in E(u) has only u in u's subset, and a net in I(u) has all its cells in u's subset. $c(n_i)$ is the weight (cost) of the net $n_i$, which is assumed to be unity unless otherwise specified.

The goal of FM is to move a cell at a time from one subset to the other subset in an attempt to minimize the cutsize of the final partition. The cell being selected for the current move is called the base cell. At the start of the process, the cell with maximum gain value in both subsets is checked first to see if its move will violate the balance criterion. If not, it is chosen as the base cell. Otherwise, the cell with maximum gain in the other subset is chosen as the base cell. The base cell, say $u_1$, is then moved to the other subset and "locked"—the locking of a moved cell is necessary to prevent thrashing (a cell being moved back and forth) and being trapped in a bad local minimum. The reduction in cutsize (in this case, the gain $g(u_1)$) is inserted in an ordered set S. The gains of all the affected neighbors are updated—a cell v is said to be a neighbor of another cell u, if v and u are connected by a common net.

The next base cell is chosen in the same way from the remaining "free" (unlocked) cells and the move proceeds until all the cells are moved and locked. Then all the partial sum $S_j = \Sigma_{t=1}^{j} g(u_t)$, $1 <= j <= n$, are computed, and p is chosen so that the partial sum $S_p$ is the maximum. This corresponds to the point of minimum cutsize in the entire moving sequence. All the cells moved after up are reversed to their previous subset so that the actually moved cells are $\{u_1, \ldots, u_p\}$ This entire process is called a pass. A number of passes are made until the maximum partial sum $S_p$ is no longer positive. This is a local minimum with respect to the initial partition $[V_1, V_2]$.

The objective function for the FM algorithm is the cut cost. The cut cost is the weight of the edges going from one partition to another partition. The time complexity for FM in a 2-way partition is O(ct), where t is the number of pins and c is the constant number of FM passes (c=5, 7 typically). One k-way iteration is achieved by doing several two-way iterations, i.e., by forming pairs of partitions and performing a two-way FM algorithm in each partition. After one k-way iteration, new pairs are formed as needed. In one embodiment, about 5 to 7 k-way iterations are performed.

In another embodiment, partitions are made using a multi-level partitioning approach. A multi-level partitioning algorithm has linear space and time complexity and delivers stable solutions of high quality. Unlike k-way FM, the quality of the solution does not depend on a pseudo-random initial partitioned state of the input graph. Quality, run-time and scalability of the partitioning stage can be improved by using multi-level partitioning algorithms, as compared to the k-way FM algorithm.

Multi-level partitioning is designed for k-way partitioning of graphs and includes a coarsening phase, an initial partitioning phase, and an uncoarsening/refinement phase. In the coarsening phase, the nodes of the input graph are clustered/coarsened in multiple steps to generate a hierarchy of graphs that are monotonically decreasing in size. Once a coarsest graph is reached, then that graph is partitioned into k partitions. The uncoarsening and refinement occurs in lockstep at all graph levels generated. At each level, the partition assigned to the parent node is also assigned to the children nodes and a local refinement is done at that level to minimize the cut cost.

The constraints used during the partitioning are the upper and lower bounds on the number of nets per partition. The upper and lower bounds help ensure a balanced number of nets per partition and reduce run time for the optimization module.

In the example shown in FIGS. 9 and 10, the graph is partitioned into partition P1, including net N1, and partition P2, including nets N2 and N3. The highest weight, w3=1.0922, represents the highest level of interaction between intersection graph nodes. The two intersection graph nodes with the edge having the highest weight are placed into the same partition. The resulting partitions are shown below:

P1: N1

P2: N2 and N3.

Develop Solution for Each Partition

An optimization module is used to find a unique solution for each net in each partition, such that the global congestion is minimized. In one embodiment, the optimization problem is formulated as a 0–1 integer programming problem such that an increase in the size of the area to be routed does not cause a large increase in the number of variables that must be considered. Rather, the number of variables is proportional to the number of nets being routed and to the number of solutions per net. By using an objective function that is a linear function of the number of solutions for each net, the optimization problem is less complex and takes less time to compute than would an objective function that is not a linear function.

Each variable represents a net solution and can take a value of 0 or 1. A value of 0 means that the solution is rejected, while a value of 1 means that the solution is accepted after global congestion resolution. For a given net, only one solution variable can have a value of 1, while all the remaining solution variables should have a value of 0. These constraints for the optimization problem are illustrated below:

$$\text{Constraints} \begin{cases} x(N1, 1) + x(N1, 2) + \ldots \quad \ldots \quad x(N1, k_1) = 1 \\ x(N2, 1) + x(N2, 2) + \ldots \quad \ldots \quad x(N2, k_2) = 1 \\ \quad \vdots \\ \quad \vdots \\ x(Np, 1) + x(Np, 2) + \ldots \quad \ldots \quad x(Np, k_p) = 1 \end{cases}$$

where $x(N_i, j) \epsilon [0, 1]$ and integer. Each solution $x(N_i, j)$ has a value of either zero or one, and the sum of all solutions for a net equals one, indicating that only one solution is selected for each net.

The objective function for the optimization module is to minimize the weighted average of the net solutions for probable congestion and delay. Ideally, no gNode should be congested. Generally, the objective function to be minimized is shown below:

$$\begin{pmatrix} [y*\text{delay}(N1, 1)] + [(1-y)*\text{congestion}(N1, 1)] + \ldots \\ [y*\text{delay}(N1, 2)] + [(1-y)*\text{congestion}(N1, 2)] + \ldots \\ [y*\text{delay}(N2, 1)] + [(1-y)*\text{congestion}(N2, 1)] + \ldots \\ \vdots \\ \vdots \end{pmatrix}$$

| Relative Weights | % Delay Violation | % Congestion (% Additional Tracks Needed) |
|---|---|---|
| $y_{dv} = 0.4$ | $DV(N1, 1) = 0$ | $Av.cong.(N1, 1) = 100$ |
| $y_{cong} = 0.6 = (1 - y_{dv})$ | $DV(N1, 2) = 0$ | $Av.cong.(N1, 2) = 100$ |
| | $DV(N1, 3) = 0$ | $Av.cong.(N1, 3) = 0$ |
| | $DV(N2, 1) = 10$ | $Av.cong.(N2, 1) = 100$ |
| | $DV(N2, 2) = 0$ | $Av.cong.(N2, 2) = 100$ |
| | $DV(N3, 1) = 20$ | $Av.cong.(N3, 1) = 0$ |
| | $DV(N3, 2) = 20$ | $Av.cong.(N3, 2) = 100$ |

Each partition is provided to the optimization module for solution selection. The nets in a partition can be simultaneously solved, thus reducing overall routing time. Since there is no dependence between nets for these solutions, synchronization is not an issue. The original gGraph can be used by each net for finding its respective set of solutions.

Each partition may be assigned a priority to be solved with respect to the other partitions, thereby assigning a sequence in which the partitions are solved. Using a priority scheme, after one partition is solved, a gtile database can be updated with the current metal utilization in each gtile. Hence, the remaining metal resources available to the next partition are reduced and the next partition has lower metal resources per gtile. Metrics that can be used to prioritize the partitions include the following:

average delay violation;
total number of nets where all solutions are violating delay constraints; and
number of noise-sensitive nets.

Partitions may be re-combined when interaction between them is high. A decision whether to re-combine nets requires a trade-off between increasing the run-time of the optimization module versus improving the quality and feasibility of the solution.

An alternative constraint can be an upper bound on the number of congested gNodes in a set of gNodes included in the global route. Such a constraint allows the optimization module to perform within a reasonable run time and assumes the possibility that the detailed router can solve the congestion problem.

In the example of FIGS. 8, 9, and 10, net N1 has three possible solutions, labeled N1, 1; N1, 2; and N1, 3 below. Net N2 has two possible solutions, labeled N2, 1 and N2, 2.

Net N3 has two possible solutions, labeled N3, 1 and N3, 2. The constraint equations for this example appear as shown below:

$$\text{Constraints} \begin{cases} x(N1, 1) + x(N1, 2) + x(N1, 3) = 1 \\ x(N2, 1) + x(N2, 2) = 1 \\ x(N3, 1) + x(N3, 2) = 1 \end{cases}$$

where $x(N_i, j) = 0$ or $1$.

The objective function is to minimize the delay violation for each solution and overall congestion on the floorplan. The weighted average of the % Delay Violation and % Additional Tracks Needed is taken, multiplied by the value of $x(N_i, j)$ (which is 0 or 1), and multiplied by the probability that the particular solution represented by $N_i, j$ will be selected.

For example, the percentage congestion value of 100 for (N1, 1) indicates that one track is available, and one more track is needed, so that a 100% increase in the number of tracks is needed. For the data presented above, the linear programming problem is set up as indicated below.

Therefore, the objective function to minimize is $$\frac{x(N1, 1)*[0*0.4 + 100*0.6]}{3} + \frac{x(N1, 2)*[0*0.4 + 100*0.6]}{3} + \frac{x(N1, 3)*[0*0.4 + 100*0.6]}{3} = 20x(N1, 1) + 20x(N1, 2)$$

$$\frac{x(N2, 1)*[10*0.4 + 100*0.6]}{2} + \frac{x(N2, 2)*[0*0.4 + 100*0.6]}{2} = \frac{x(N2, 1)*10}{2} + \frac{x(N2, 2)*6}{2} = 32x(N2, 1) + 30x(N2, 2)$$

$$\frac{x(N3, 1)*[20*0.4 + 0*0.6]}{2} + \frac{x(N3, 2)*[20*0.4 + 100*0.6]}{2} = \frac{x(N3, 1)*8}{2} + \frac{x(N3, 2)*68}{2} = 4x(N3, 1) + 34x(N3, 2)$$

Solving this equation, the resulting values of $x(N_i, j)$ are given below:

20x(N1,1)+20x(N1,2)+32x(N2,1)+30x(N2,2)+4x(N3,1)+34x(N3,2)

x(N1,1)=0, x(N1, 2)=0, x(N1, 3)=1
x(N2,1)=0, x(N2,2)=1
x(N3,1)=1, x(N3,2)=0

These solutions correspond to path $t_{13}$ for net N1, path $t_{22}$ for net N2, and path $t_{31}$ for net N3.

Provide Output as Input for Detailed Router

The optimized paths through each partition are provided as input to the detailed router, as shown in Detailed Routing step 130 of FIG. 1. The detailed router uses information about the number of tracks for each metal layer to assign a track for each node through which the net must be routed. The output of the detailed router is representative of the routed circuit design, as indicated by Output Representative of Routed Circuit Design step 140 of FIG. 1.

High performance designs require extensive resources for routing. The interconnection line length and congestion constraints provided in routing tools by current EDA vendors require multiple iterations to finalize a design and may not take into account constraints such as timing constraints. The present invention introduces a new constraint-driven global routing algorithm which takes design constraints into account while performing the global routing step. Initial testing results show that this global router helps achieve better results than are achieved by current commercially available routers. The global router of the present invention can be used as a stand-alone tool before performing the detailed routing step, or the global router can be used to route constraint-driven nets together with other global routers that do not handle constraint-driven nets.

Other Embodiments

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

The foregoing described embodiments show different components contained within other components (i.e., the floor planning component may be a component of the global routing tool or the floor planning component may be a stand-alone tool). It is to be understood that such described architectures are merely examples, and that in fact many other architectures can be implemented which achieve the same functionality. In an abstract but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

The foregoing detailed description has set forth various embodiments of the present invention via the use of block diagrams, flowcharts, and examples. It will be understood by those within the art that each block diagram component, flowchart step, operation and/or component illustrated by the use of examples can be implemented, individually and/or collectively, by a wide range of hardware, software, firmware, or any combination thereof.

The present invention has been described in the context of software running on fully functional computer systems; however, those skilled in the art will appreciate that the present invention is capable of being distributed as a program product in a variety of forms, and that the present invention applies equally regardless of the particular type of signal bearing media used to actually carry out the distribution. Examples of signal bearing media include recordable media such as floppy disks and CD-ROM, transmission type media such as digital and analog communications links, as well as media storage and distribution systems developed in the future.

The above-discussed embodiments may be implemented by software modules that perform certain tasks. The software modules discussed herein may include script, batch, or other executable files. The software modules may be stored on a machine-readable or computer-readable storage medium such as a disk drive. Storage devices used for storing software modules in accordance with an embodiment of the invention may be magnetic floppy disks, hard disks, or optical discs such as CD-ROMs or CD-Rs, for example. A storage device used for storing firmware or hardware modules in accordance with an embodiment of the invention may also include a semiconductor-based memory, which may be permanently, removably or remotely coupled to a microprocessor/memory system. Thus, the modules may be stored within a computer system memory to configure the computer system to perform the functions of the module. Other new and various types of computer-readable storage media may be used to store the modules discussed herein.

In the example described herein, path delay is used for pruning the set of solutions for each net. Other constraints such as noise avoidance can be used to prune the solutions. Nets whose solutions appear in the same gNode as a net to be avoided can be dropped. This criteria will slow the algorithm down, since pruning of solutions might be expensive.

A cell insertion constraint can also be implemented for this algorithm. Solutions which have the highest chance of connecting to the pre-placed cells to satisfy the delay or transition time requirements are the only ones considered for each net.

Shielding requirements can be considered by the global router of the present invention while performing global routing. The solutions for a net that would use the shielding tracks required by the net can be eliminated from the solution set. Shielding constraints may lead to pruning solutions that may have originally appeared to be viable routing solutions.

The above description is intended to be illustrative of the invention and should not be taken to be limiting. Other embodiments within the scope of the present invention are possible. Those skilled in the art will readily implement the steps necessary to provide the structures and the methods disclosed herein, and will understand that the process parameters and sequence of steps are given by way of example only and can be varied to achieve the desired structure as well as modifications that are within the scope of the invention. Variations and modifications of the embodiments disclosed herein can be made based on the description set forth herein, without departing from the scope of the invention.

Consequently, the invention is intended to be limited only by the scope of the appended claims, giving full cognizance to equivalents in all respects.

What is claimed is:

1. A method for performing routing in the physical design of an integrated circuit, the method comprising:

finding a solution set comprising at least one route solution for each net of a plurality of nets of an integrated circuit design;
creating an intersection graph for the nets using the solution set for the nets, wherein the intersection graph includes a plurality of nodes each corresponding to a respective one of the nets and one or more edges, and wherein each of the nodes whose nets share a region on a floorplan of the circuit are connected by a respective one of the edges;
partitioning the intersection graph into a plurality of partitions;
identifying an optimal solution satisfying a constraint for each partition of the partitions; and
using the optimal solution for each partition to complete a global routing for the design such that the global routing satisfies the constraint.

2. The method of claim 1 wherein
the identifying the optimal solution for each partition is performed in order of a relative priority of each partition within the partitions.

3. The method of claim 1 wherein
the identifying the optimal solution for each partition is performed using an objective function that corresponds to a linear function of a number of solutions for each net.

4. The method of claim 3 wherein
the objective function includes a factor for a probability of selection of each solution of the solutions.

5. The method of claim 1 wherein
the constraint comprises a timing constraint.

6. The method of claim 1 wherein
the constraint comprises a shielding constraint.

7. The method of claim 1 wherein
the constraint comprises a noise avoidance constraint.

8. The method of claim 1 wherein
the constraint comprises a cell insertion constraint.

9. The method of claim 1 further comprising:
creating a three-dimensional graph of the integrated circuit design prior to finding the solution set for each net.

10. The method of claim 9 further comprising:
adding an edge between a first intersection graph node of the intersection graph and a second intersection graph node of the intersection graph, wherein
the first intersection graph node represents a first net,
the second intersection graph node represents a second net, and
the edge indicates that the first net and the second net share a node belonging to the three-dimensional graph.

11. The method of claim 10 further comprising:
calculating a weight for the edge using the following:
a percentage of the solutions including an intersection of at least two nets; and
an average congestion of intersecting nodes.

12. The method of claim 11 further comprising:
pruning the intersection graph according to the weight assigned to the edge prior to the partitioning.

13. The method of claim 1 wherein
the finding the solution set comprises using Mikami line search algorithm.

14. The method of claim 1 wherein
the finding the solution set comprises using a Steiner tree-based algorithm.

15. The method of claim 1 wherein
the finding the solution set comprises:
pairing a sink pin of a given net of the nets with a driver pin for the given net for each path of a plurality of paths in the given net;
generating at least one routing solution for each path; and
merging the routing solutions to give the solution set for the given net.

16. The method of claim 1 further comprising:
pruning the solution set for each net according to a timing delay.

17. The method of claim 16 wherein
the pruning further comprises pruning according to a length constraint.

18. The method of claim 1 further comprising:
eliminating a given solution from the solution set for each net when the given solution has a timing violation.

19. The method of claim 1 wherein
the partitioning the intersection graph comprises using a Fiduccia Mattheyses algorithm.

20. The method of claim 1 wherein
the partitioning the intersection graph comprises using a multi-level partitioning algorithm.

21. The method of claim 1 wherein
the partitioning is performed such that each of the partitions comprises at least two nets of the integrated circuit design that interact.

22. The method of claim 1 wherein
the partitioning is constrained by an upper bound and a lower bound of a number of nets per partition.

23. The method of claim 1 wherein
the partitioning comprises using a first measure of delay for each net and a second measure of congestion of each net.

24. The method of claim 1 wherein
the partitioning is performed such that two nets interacting to produce noise are placed into one partition.

25. The method of claim 1 wherein
the partitioning is performed such that nets that interact are placed in the same partition.

26. The method of claim 1 wherein
the partitioning is performed such that no two partitions interact with each other.

27. The method of claim 1 wherein
the partitioning is performed such that no two partitions interact with each other at a congested node.

28. The method of claim 1 wherein
the optimal solution minimizes congestion for each node of the design.

29. The method of claim 1 wherein
the optimal solution minimizes a weighted average of congestion and delay.

30. The method of claim 1 wherein
the identifying the optimal solution for each partition comprises finding an optimal solution for each net in the partition simultaneously.

31. A method for performing routing in the physical design of an integrated circuit, the method comprising:
finding a route solution for each net of a plurality of nets of an integrated circuit design;
creating an intersection graph for the nets using each route solution for each net of the nets, wherein the intersection graph includes a plurality of nodes each corresponding to a respective one of the nets and one or more edges, and wherein each of the nodes whose nets share a region on a floorplan of the circuit are connected by a respective one of the edges;

partitioning the intersection graph into a plurality of partitions;

identifying an optimal solution satisfying a constraint for each partition of the partitions; and using the optimal solution for each partition to complete a global routing for the design such that the global routing satisfies the constraint.

32. A system for performing routing in the physical design of an integrated circuit, the system comprising:

finding means for finding a solution set comprising at least one route solution for each net of a plurality of nets of an integrated circuit design;

creating means for creating an intersection graph for the nets using the solution set for the nets, wherein the intersection graph includes a plurality of nodes each corresponding to a respective one of the nets and one or more edges, and wherein each of the nodes whose nets share a region on a floorplan of the circuit are connected by a respective one of the edges;

partitioning means for partitioning the intersection graph into a plurality of partitions;

identifying means for identifying an optimal solution satisfying a constraint for each partition of the partitions; and using means for using the optimal solution for each partition to complete a global routing for the design such that the global routing satisfies the constraint.

33. The system of claim 32 wherein the identifying the optimal solution for each partition is performed using an objective function that corresponds to a linear function of a number of solutions for each net.

34. The system of claim 33 wherein the objective function includes a factor for a probability of selection of each solution of the solutions.

35. The system of claim 32 further comprising:

graph-creating means for creating a three-dimensional graph of the integrated circuit design prior to finding the solution set for each net.

36. The system of claim 35 further comprising:

edge-adding means for adding an edge between a first intersection graph node of the intersection graph and a second intersection graph node of the intersection graph, wherein the first intersection graph node represents a first net, the second intersection graph node represents a second net, and the edge indicates that the first net and the second net share a node belonging to the three-dimensional graph.

37. The system of claim 36 further comprising:

calculating means for calculating a weight for the edge using the following:

a percentage of the solutions including an intersection of at least two nets; and an average congestion of intersecting nodes.

38. The system of claim 37 further comprising:

pruning means for pruning the intersection graph according to the weight assigned to the edge prior to the partitioning.

39. The system of claim 32 wherein the finding means further comprise:

pairing means for pairing a sink pin of a given net of the nets with a driver pin for the given net for each path of a plurality of paths in the given net;

generating means for generating at least one routing solution for each path; and merging means for merging the routing solutions to give the solution set for the given net.

40. The system of claim 32 further comprising:

eliminating means for eliminating a given solution from the solution set for each net when the given solution has a timing violation.

41. The system of claim 32 wherein the partitioning means perform the partitioning such that each of the partitions comprises at least two nets of the integrated circuit design that interact.

42. The system of claim 32 wherein the partitioning means perform the partitioning constrained by an upper bound and a lower bound of a number of nets per partition.

43. The system of claim 32 wherein the partitioning means use a first measure of delay for each net and a second measure of congestion of each net.

44. The system of claim 32 wherein the partitioning means perform the partitioning such that nets that interact are placed in the same partition.

45. The system of claim 32 wherein the partitioning means perform the partitioning such that no two partitions interact with each other.

46. A computer program product for performing routing in the physical design of an integrated circuit, the computer program product comprising:

finding instructions to find a solution set comprising at least one route solution for each net of a plurality of nets of an integrated circuit design;

creating instructions to create an intersection graph for the nets using the solution set for the nets, wherein the intersection graph includes a plurality of nodes each corresponding to a respective one of the nets and one or more edges, and wherein each of the nodes whose nets share a region on a floorplan of the circuit are connected by a respective one of the edges;

partitioning instructions to partition the intersection graph into a plurality of partitions;

identifying instructions to identify an optimal solution satisfying a constraint for each partition of the partitions;

using instructions to use the optimal solution for each partition to complete a global routing for the design such that the global routing satisfies the constraint; and a computer-readable medium to store the finding instructions, the creating instructions, the partitioning instructions, the identifying instructions, and the using instructions.

47. The computer program product of claim 46 wherein the identifying instructions identify the optimal solution for each partition using an objective function that corresponds to a linear function of a number of solutions for each net.

48. The computer program product of claim 47 wherein the objective function includes a factor for a probability of selection of each solution of the solutions.

49. The computer program product of claim 46 further comprising:

graph-creating instructions to create a three-dimensional graph of the integrated circuit design prior to finding the solution set for each net, wherein the computer-readable medium further stores the graph-creating instructions.

50. The computer program product of claim 49 further comprising:
edge-adding instructions to add an edge between a first intersection graph node of the intersection graph and a second intersection graph node of the intersection graph, wherein
the first intersection graph node represents a first net,
the second intersection graph node represents a second net,
the edge indicates that the first net and the second net share a node belonging to the three-dimensional graph, and
the computer-readable medium further stores the edge-adding instructions.

51. The computer program product of claim 50 further comprising:
calculating instructions to calculate a weight for the edge using the following:
a percentage of the solutions including an intersection of at least two nets; and
an average congestion of intersecting nodes, wherein
the computer-readable medium further stores the calculating instructions.

52. The computer program product of claim 51 further comprising:
pruning instructions to prune the intersection graph according to the weight assigned to the edge prior to the partitioning, wherein
the computer-readable medium further stores the pruning instructions.

53. The computer program product of claim 46 wherein the finding instructions further comprise:
pairing instructions to pair a sink pin of a given net of the nets with a driver pin for the given net for each path of a plurality of paths in the given net;
generating instructions to generate at least one routing solution for each path; and
merging instructions to merge the routing solutions to give the solution set for the given net, wherein
the computer-readable medium further stores the pairing instructions, the generating instructions and the merging instructions.

54. The computer program product of claim 46 further comprising:
eliminating instructions to eliminate a given solution from the solution set for each net when the given solution has a timing violation wherein
the computer-readable medium further stores the eliminating instructions.

55. The computer program product of claim 46 wherein the partitioning instructions perform the partitioning such that each of the partitions comprises at least two nets of the integrated circuit design that interact.

56. The computer program product of claim 46 wherein the partitioning instructions perform the partitioning constrained by an upper bound and a lower bound of a number of nets per partition.

57. The computer program product of claim 46 wherein the partitioning instructions use a first measure of delay for each net and a second measure of congestion of each net.

58. The computer program product of claim 46 wherein the partitioning instructions perform the partitioning such that nets that interact are placed in the same partition.

59. The computer program product of claim 46 wherein the partitioning instructions perform the partitioning such that no two partitions interact with each other.

60. A computer system for performing routing in the physical design of an integrated circuit, the computer system comprising:
a processor for executing instructions; and
a memory to store the instructions, wherein the instructions comprise:
finding instructions to find a solution set comprising at least one route solution for each net of a plurality of nets of an integrated circuit design;
creating instructions to create an intersection graph for the nets using the solution sets for the nets, wherein the intersection graph includes a plurality of nodes each corresponding to a respective one of the nets and one or more edges, and wherein each of the nodes whose nets share a region on a floorplan of the circuit are connected by a respective one of the edges;
partitioning instructions to partition the intersection graph into a plurality of partitions;
identifying instructions to identify an optimal solution satisfying a constraint for each partition of the partitions; and
using instructions to use the optimal solution for each partition to complete a global routing for the design such that the global routing satisfies the constraint.

61. The computer system of claim 60 wherein
the identifying instructions identify the optimal solution for each partition using an objective function that corresponds to a linear function of a number of solutions for each net.

62. The computer system of claim 61 wherein
the objective function includes a factor for a probability of selection of each solution of the solutions.

63. The computer system of claim 60 wherein the instructions further comprise:
graph-creating instructions to create a three-dimensional graph of the integrated circuit design prior to finding the solution set for each net.

64. The computer system of claim 63 wherein the instructions further comprise:
edge-adding instructions to add an edge between a first intersection graph node of the intersection graph and a second intersection graph node of the intersection graph, wherein
the first intersection graph node represents a first net,
the second intersection graph node represents a second net, and
the edge indicates that the first net and the second net share a node belonging to the three-dimensional graph.

65. The computer system of claim 64 wherein the instructions further comprise:
calculating instructions to calculate a weight for the edge using the following:
a percentage of the solutions including an intersection of at least two nets; and
an average congestion of intersecting nodes.

66. The computer system of claim 65 wherein the instructions further comprise:
pruning instructions to prune the intersection graph according to the weight assigned to the edge prior to the partitioning.

67. The computer system of claim 60 wherein
the finding instructions further comprise:
pairing instructions to pair a sink pin of a given net of the nets with a driver pin for the given net for each path of a plurality of paths in the given net;
generating instructions to generate at least one routing solution for each path; and merging instructions to merge the routing solutions to give the solution set for the given net.

68. The computer system of claim 60 wherein the instructions further comprise:
eliminating instructions to eliminate a given solution from the solution set for each net when the given solution has a timing violation.

69. The computer system of claim 60 wherein
the partitioning instructions perform the partitioning such that each of the partitions comprises at least two nets of the integrated circuit design that interact.

70. The computer system of claim 60 wherein
the partitioning instructions perform the partitioning constrained by an upper bound and a lower bound of a number of nets per partition.

71. The computer system of claim 60 wherein
the partitioning instructions use a first measure of delay for each net and a second measure of congestion of each net.

72. The computer system of claim 60 wherein
the partitioning instructions perform the partitioning such that nets that interact are placed in the same partition.

73. The computer system of claim 60 wherein
the partitioning instructions perform the partitioning such that no two partitions interact with each other.

74. A system for performing routing in the physical design of an integrated circuit, the system comprising:
a finding module to find a solution set comprising at least one route solution for each net of a plurality of nets of an integrated circuit design;
a creating module to create an intersection graph for the nets using the solution sets for the nets, wherein the intersection graph includes a plurality of nodes each corresponding to a respective one of the nets and one or more edges, and wherein each of the nodes whose nets share a region on a floorplan of the circuit are connected by a respective one of the edges;
a partitioning module to partition the intersection graph into a plurality of partitions;
an identifying module to identify an optimal solution satisfying a constraint for each partition of the partitions; and
a using module to use the optimal solution for each partition to complete a global routing for the design such that the global routing satisfies the constraint.

75. The system of claim 74 wherein
the identifying module identifies the optimal solution for each partition using an objective function that corresponds to a linear function of a number of solutions for each net.

76. The system of claim 75 wherein
the objective function includes a factor for a probability of selection of each solution of the solutions.

77. The system of claim 74 further comprising:
a graph-creating module to create a three-dimensional graph of the integrated circuit design prior to finding the solution set for each net.

78. The system of claim 77 further comprising:
an edge-adding module to add an edge between a first intersection graph node of the intersection graph and a second intersection graph node of the intersection graph, wherein
the first intersection graph node represents a first net,
the second intersection graph node represents a second net, and
the edge indicates that the first net and the second net share a node belonging to the three-dimensional graph.

79. The system of claim 78 further comprising:
a calculating module to calculate a weight for the edge using the following:
a percentage of the solutions including an intersection of at least two nets; and
an average congestion of intersecting nodes.

80. The system of claim 79 further comprising:
a pruning module to prune the intersection graph according to the weight assigned to the edge prior to the partitioning.

81. The system of claim 74 wherein
the finding module further comprises:
a pairing module to pair a sink pin of a given net of the nets with a driver pin for the given net for each path of a plurality of paths in the given net;
a generating module to generate at least one routing solution for each path; and
a merging module to merge the routing solutions to give the solution set for the given net.

82. The system of claim 74 further comprising:
an eliminating module to eliminate a given solution from the solution set for each net when the given solution has a timing violation.

83. The system of claim 74 wherein
the partitioning module performs the partitioning such that each of the partitions comprises at least two nets of the integrated circuit design that interact.

84. The system of claim 74 wherein
the partitioning module performs the partitioning constrained by an upper bound and a lower bound of a number of nets per partition.

85. The system of claim 74 wherein
the partitioning module uses a first measure of delay for each net and a second measure of congestion of each net.

86. The system of claim 74 wherein
the partitioning module performs the partitioning such that nets that interact are placed in the same partition.

87. The system of claim 74 wherein
the partitioning module performs the partitioning such that no two partitions interact with each other.

88. A method for performing routing in a physical design of an integrated circuit comprising:
creating an intersection graph comprising a plurality of nodes and one or more edges, wherein each of the plurality of nodes represents a solution set associated with a respective one of a plurality of nets of an integrated circuit design and wherein each of the nodes whose nets share a region on a floorplan of the circuit are connected by a respective one of the edges;
partitioning the intersection graph into a plurality of partitions; and
selecting a solution that satisfies constraints associated with each of the partitions, wherein the selected solution is associated with a global routing solution.

* * * * *